(12) United States Patent
Subramanian et al.

(10) Patent No.: US 9,343,202 B2
(45) Date of Patent: May 17, 2016

(54) TRANSPARENT METAL OXIDE NANOPARTICLE COMPOSITIONS, METHODS OF MANUFACTURE THEREOF AND ARTICLES COMPRISING THE SAME

(71) Applicant: THE REGENTS OF THE UNIVERSITY OF CALIFORNIA, Oakland, CA (US)

(72) Inventors: Vivek Subramanian, Orinda, CA (US); Steven K. Volkman, Livermore, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 170 days.

(21) Appl. No.: 13/960,955

(22) Filed: Aug. 7, 2013

(65) Prior Publication Data

US 2015/0044361 A1   Feb. 12, 2015

(51) Int. Cl.
| | |
|---|---|
| *B05D 5/12* | (2006.01) |
| *H01B 13/00* | (2006.01) |
| *C09D 5/24* | (2006.01) |
| *H01B 1/08* | (2006.01) |
| *H01L 31/18* | (2006.01) |
| *C09D 1/00* | (2006.01) |

(52) U.S. Cl.
CPC ............. *H01B 13/0026* (2013.01); *C09D 1/00* (2013.01); *C09D 5/24* (2013.01); *H01B 1/08* (2013.01); *H01B 13/0016* (2013.01); *H01L 31/1884* (2013.01)

(58) Field of Classification Search
CPC .......... H01L 1/00; H01L 21/025; B82Y 10/00
USPC ....................................... 427/126.3
See application file for complete search history.

(56) References Cited

U.S. PATENT DOCUMENTS

| | | | |
|---|---|---|---|
| 7,402,506 | B2 | 7/2008 | Levy et al. |
| 7,727,909 | B2 | 6/2010 | Alarco |
| 8,017,458 | B2 | 9/2011 | Marks et al. |
| 2006/0247354 | A1 | 11/2006 | He |
| 2006/0286737 | A1 | 12/2006 | Levy |
| 2007/0020771 | A1 | 1/2007 | Dutta |
| 2008/0286907 | A1 | 11/2008 | Li et al. |
| 2015/0044361 | A1* | 2/2015 | Subramanian et al. .... 427/126.3 |

OTHER PUBLICATIONS

Meyers et al., "Aqueous Inorganic Inks for Low-Temperature Fabrication of ZnO TFTs" J. Am. Chem. Soc. 2008, 130, 17603-17609.
Ong et al., "Stable, Solution-Processed, High-Mobility ZnO Thin-Film Transistors" J. Am. Chem. Soc. 2007, 129, 2750-2751.
French Search Report for FR application No. 1457566; Report Mail Date Aug. 27, 2015 (5 pages).

* cited by examiner

*Primary Examiner* — Khanh Tuan Nguyen
(74) *Attorney, Agent, or Firm* — Cantor Colburn LLP

(57) ABSTRACT

Disclosed herein is a composition for making a thin film comprising a solvent; a plurality of particles; the particles being derived by reacting a metal salt with itself or with a ligand; where the metal salt forms metal oxides and/or metal hydroxides upon reacting with itself or with a ligand; and where the particles have a metal oxide content that is substantially greater than their metal hydroxide content when heated at a temperature of less than or equal to 200° C. Disclosed herein too is a method for making the composition.

6 Claims, 2 Drawing Sheets

TRANSPARENT METAL OXIDE NANOPARTICLE COMPOSITIONS, METHODS OF MANUFACTURE THEREOF AND ARTICLES COMPRISING THE SAME

BACKGROUND

This disclosure relates to transparent metal oxide compositions, methods of manufacture thereof and to articles comprising the same.

Transparent semiconductors are used in thin film transistors (TFT) as backplanes in electronic display applications. The greater the transparency of the semiconductor, the greater the amount of light which is able to pass through the semiconductor.

Transparent oxides have electronic and optical properties that allow them to be transparent to visible light (i.e., optically transparent) when used in thin films. These transparent oxides may also have electrically conducting or semi-conducting properties. A transparent oxide semiconductor or conductor thin film, may be deposited on a substrate using various vapor deposition methods such as sputtering, evaporation and pulsed laser deposition. A significant drawback of these techniques is that the cost of using such techniques becomes quite expensive when they are used on display substrates having large areas.

The deposition of transparent oxide thin films on large area substrates using a liquid solution-phase (i.e., a solution based) process provides a less costly alternative to such vapor deposition methods. However, a significant drawback associated with the use of liquid solutions methods is that often subsequent annealing temperatures greater than 200° C., and even 400° C., are used to produce a thin film with adequate properties and morphology. Such temperatures are unsuitable for plastic substrates since plastic materials may suffer from significant mechanical deformation, melting and/or chemical degradation such as yellowing when exposed temperatures in excess of 200° C.

There is therefore a need for a transparent oxide thin film that can be produced at temperatures lower than 200° C.

SUMMARY

Disclosed herein is a composition for making a thin film comprising a solvent; a plurality of particles; the particles being derived by reacting a metal salt with itself or with a ligand; where the metal salt forms metal oxides and/or metal hydroxides upon reacting with itself or with a ligand; and where the particles have a metal oxide content that is substantially greater than their metal hydroxide content when heated at a temperature of less than or equal to 200° C.

Disclosed herein too is a method comprising mixing a metal salt with a solvent to form a reaction mixture; where the metal salt reacts with itself or with a ligand to form metal oxides and/or metal hydroxides; and where the metal oxide content is substantially greater than the metal hydroxide content when heated at a temperature of less than or equal to 200° C.; adding a pH agent to the reaction mixture; and disposing the reaction mixture on a substrate.

BRIEF DESCRIPTION OF THE DRAWINGS

For a detailed understanding of the present disclosure, reference should be made to the following detailed description, taken in conjunction with the accompanying drawings in which like elements have generally been designated with like numerals and wherein.

DESCRIPTION OF EMBODIMENTS

Figure 1:
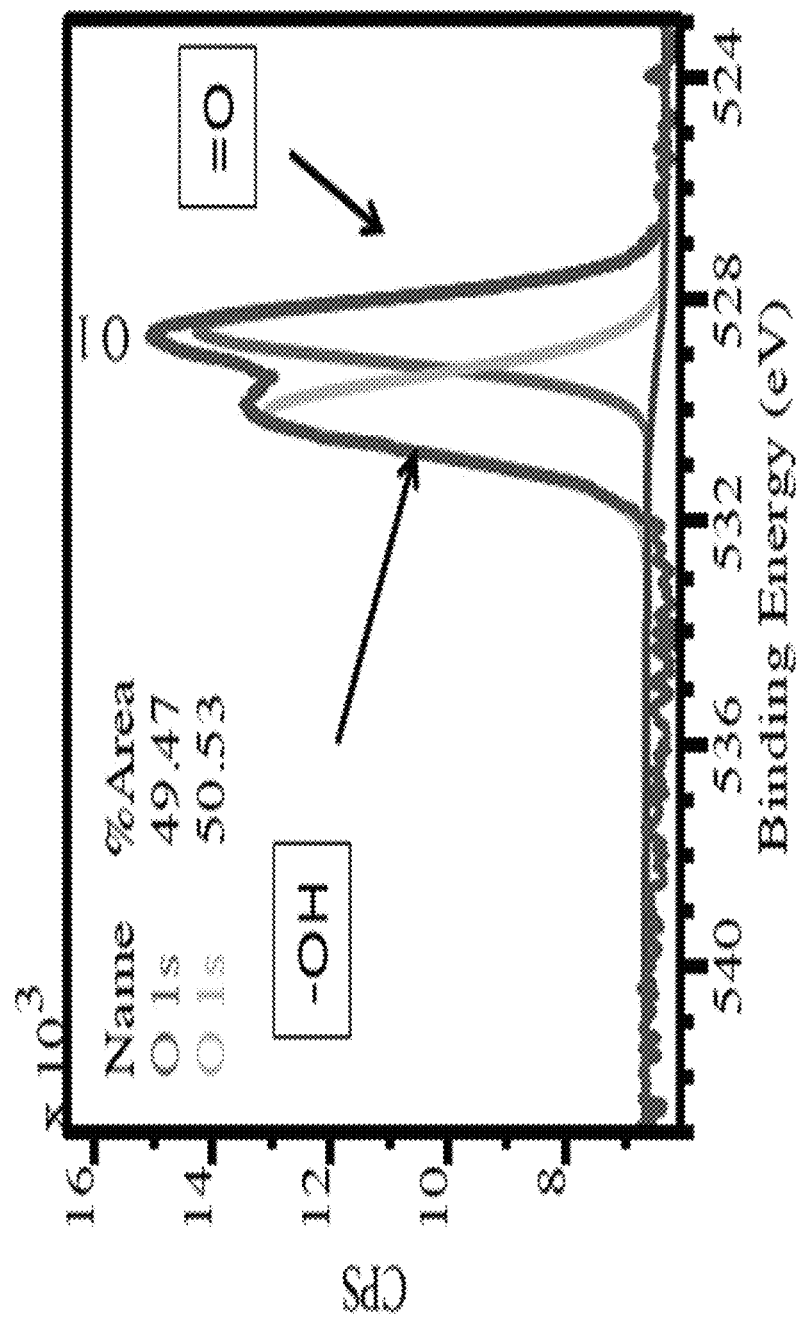
FIG. 1 is an X-ray photoelectron spectroscopy (XPS) spectra graph of the intensity in counts per second (CPS) versus the binding energy (eV) of the thin film described herein.

Transparent oxides are used in thin films to form thin film transistors (TFT) for electronic display applications and are also used to form conductive patterns for other electronic devices such as solar cells and photodetectors. Disclosed herein is a method of manufacturing the thin film that may be used in thin film transistors or in other articles and devices. The method comprises mixing a metal salt with a suitable solvent to form a reaction mixture in a controlled pH to produce particles that have a metal oxide species and/or a metal hydroxide species. The reactants and the reaction mixture are devoid of water. The particles can be nanoparticles, or microparticles. The amount of the metal oxide species in the particles is substantially greater than the metal hydroxide species. The particles along with the solvent is then disposed upon a substrate and subjected to annealing at a temperature of less than or equal to 200° C. The annealing drives off the solvent, facilitates further reactions between the metal hydroxide species converting them to metal oxide species and leaves behind a thin film that is optically transparent without pores and voids. The temperature of annealing is low enough to prevent deformation, degradation or distortion of the substrate or the thin film. It is to be noted that while the solvent may solubilize the metal salt, it may or may not solubilize the particles. In one embodiment, the solvent may be effective to suspend the particles.

A metal salt is mixed with a solvent at a controlled pH. The controlled pH and/or the selection of the metal salt favors the formation of particles whose metal oxide content is substantially greater than the metal hydroxide content. The presence of a substantially larger amount of metal oxides than the metal hydroxides in the particles facilitates the formation of thin films at temperatures of less than or equal to 200° C. Because of the lower annealing temperatures, the thin films produced by this method are less expensive than those produced by other methods including sputtering, evaporation and pulsed laser deposition. In addition, the use of a lower temperature allows for using a larger variety of different materials during the production of the metal oxide. The thin film has an optical transparency greater than or equal to about 80%, good electron mobility and/or a large bandgap.

Disclosed herein too is a composition for making an optically transparent thin film comprising a solvent and a plurality of particles whose metal oxide content is substantially greater than their metal hydroxide content. In one embodiment, the solvent may be a fluid which suspends the particles and does not solvate them. In another embodiment, the solvent may partially or completely solvate the particles.

The particles are preferably selected from nanoparticles and microparticles. Nanoparticles have an average particle size of less than or equal to about 100 nanometers. Microparticles have an average particle size of greater than 100 nanometers to less than 10 micrometers. The average particle size is determined by the radius of gyration as determined by light scattering.

Preferably the metal salt is capable of reacting with itself to produce metal oxides and metal hydroxides. The metal salt comprises a metal cation and at least one anion. Preferably the metal salt comprises a metal cation selected from Groups II through VII of the periodic table of elements as well as an organic or an inorganic anion. More preferably the metal cation is selected from zinc, aluminum, titanium, cerium, silicon, zirconium, yttrium, indium, tin, gallium, cadmium, or a combination comprising at least one of the foregoing cations. Still more preferably the metal cation is selected from zinc, indium or tin. Most preferably the metal cation is zinc. Preferably the at least one anion is selected from acetates ($CH_3COO^-$), carbonates ($CO_3^{2-}$), chlorides ($Cl^-$), citrates ($HOC(COO^-)(CH_2COO^-)_2$), cyanides ($C\equiv N^-$), nitrates ($NO_3^-$), nitrites ($NO_2^-$), phosphates ($PO_4^{3-}$), sulfates ($SO_4^{2-}$), fluorides ($F^-$), borates ($BO_3^{2-}$), sulfites ($SO_3^{2-}$), chlorates ($ClO_3^-$), bicarbonates ($CHO3^-$), bromides ($Br^-$), iodides ($I^-$), or a combination comprising at least one of the foregoing anions. More preferably the at least one anion is selected from acetates, nitrates, and chlorides. Most preferably the at least one anion is an acetate. Preferably the metal salt is selected from the group of zinc acetate, indium acetate, zinc chloride, indium chloride, indium nitrate and zinc nitrate. Most preferably the metal salt is zinc acetate.

Preferably the composition comprises 0.1 to 20 wt %, more preferably 0.1 to 20 wt %, and most preferably 0.1 to 5 wt % of the metal salt, based on the total weight of the mixture of the metal salt and the solvent.

Preferably the metal salt is dispersed in the solvent. One of ordinary skill in the art will know to select an appropriate solvent based on the substrate and the metal salt used. The solvent can solvate the metal salt and which drives the formation of metal oxides instead of metal hydroxides. In one embodiment, the solvent is aprotic solvent. In another embodiment, the solvent is a protic solvent. In another embodiment, the solvent is a polar solvent. In yet another embodiment, the solvent is a non-polar solvent. Examples of non-polar solvents are pentane, cyclopentane, hexane, cyclohexane, benzene, toluene, 1,4-dioxane, chloroform, diethyl ether, and the like. Examples of polar aprotic solvents are dichloromethane, tetrahydrofuran, ethyl acetate, acetone, dimethyl formamide, acetonitrile, dimethyl sulfoxide, propylene carbonate, and the like. Preferably the solvent is selected from the group of formic acid, n-butanol, isopropanol, n-propanol, ethanol, methanol, acetic acid, ammonium hydroxide, nitromethane and combinations thereof. Most preferably the solvent is a combination of methanol and ammonium hydroxide.

Preferably the composition comprises 80 to 99.9 wt %, more preferably 90 to 99.9 wt %; and most preferably 95 to 99.9 wt % of the solvent, based on the total weight of the mixture of the metal salt and solvent.

Preferably the method further comprises adding a pH agent. The pH agent is selected to adjust the pH of the reaction mixture of the metal salt and the solvent to a pH that favors the formation of metal oxides over the formation of metal hydroxides. One of ordinary skill in the art will know to select an appropriate pH based upon the particular metal salt and solvent employed.

In one embodiment, the pH agent is a base. In another embodiment, the pH agent is an acid. Examples of suitable basic pH agents include potassium hydroxide (KOH), barium hydroxide ($Ba(OH)_2$), cesium hydroxide (CsOH), sodium hydroxide (NaOH), strontium hydroxide ($Sr(OH)_2$), calcium hydroxide ($Ca(OH)_2$), lithium hydroxide (LiOH), rubidium hydroxide (RbOH), lithium diisopropylamide (LDA) ($C_6H_{14}LiN$), lithium diethylamide (LDEA), lithium diethylamide (LDEA), sodium amide ($NaNH_2$), sodium hydride (NaH), lithium bis(trimethylsilyl)amide ($((CH_3)_3Si)_2NLi$), ammonium hydroxide ($NH_4OH$) and the like.

Examples of suitable acidic pH agents include hydrochloric acid (HCl), hydroiodic acid (HI), hydrobromic acid (HBr), perchloric acid ($HClO_4$), nitric acid ($HNO_3$), sulfuric acid ($H_2SO_4$), and the like. In an exemplary embodiment, the pH agent is a base and the metal in the metal salt is zinc or indium.

In one embodiment, the pH of the mixture of the metal salt and solvent is 1 to 14, specifically 3 to 12, and more specifically 4 to 10. In another embodiment, the pH of the mixture of the metal salt and solvent is 1 to 7, specifically 2 to 6, and more specifically 3 to 5. In another embodiment, the pH of the mixture of the metal salt and solvent is 7 to 14, specifically 8 to 12, and more specifically 9 to 11. An exemplary pH is 8 to 12. The addition of the pH agent to the metal salt and solvent facilitates the reaction between the metal salt molecules or the metal salt with the ligand to produce the particles. In one embodiment, the pH of the metal oxide and solvent used at the beginning of the reaction may be acidic (i.e., less than 7), while the pH at the end of the reaction may be basic (i.e., greater than 7). This is accomplished by first using an acidic pH agent and then adding a basic pH agent after the reaction has progressed to a certain desired extent. In another embodiment, the pH of the metal oxide and solvent used at the beginning of the reaction may be basic (i.e., greater than 7), while the pH at the end of the reaction may be acidic (i.e., less than 7). This is accomplished by first using a basic pH agent and then adding an acidic pH agent after the reaction has progressed to a certain desired extent.

Based on the teachings provided herein, one of ordinary skill in the art will be able to select an appropriate pH range for use with the particular metal salt and solvent employed by reference to a Pourbaix diagram of the relevant constituents. While Pourbaix diagrams are commonly defined for aqueous environments, similar diagrams may be developed for the solvent systems herein. The lines in such a Pourbaix diagram show the equilibrium conditions, that is, where the activities are equal, for the species (or reaction products) on each side of that line. On either side of the line, one form of the species will instead be said to be predominant. The pH, and/or the suitable pH agent, is selected such that the formation of the metal oxide species is predominant over the formation of the metal hydroxide species.

Preferably the reaction mixture comprises 0.01 to 10 wt %, more preferably greater than 0.05 to 5 wt %; and most preferably greater than 0.1 to 1 wt % of the pH agent based on the total wt % of the reaction mixture of the metal salt and solvent.

Preferably the method further comprises adding a ligand to the reaction mixture of the metal salt and solvent. Examples of suitable ligands include iodides ($I^-$), bromides ($Br^-$), sulfides ($S_2^-$), thiocyanates ($S-CN^-$), chlorides ($Cl^-$), nitrates ($O-NO_2^-$), azides ($N-N_2^-$), fluorides ($F^-$), hydroxides ($OH^-$), oxalates ($O-H-$), nitrites ($O-N-O^-$), isothicyanates ($N=C=S^-$), acetonitriles ($CH_3CN$), pyridines ($C_5H_5N$), ammonia ($NH_3$), ethylenediamine 2,2'-bipyridine, 1,10-phenanthrolines, triphenylphosphones ($PPh_3$), cyanide ($CN^-$) and, carbon monoxide (CO). The ligands help to stabilize the particles formed against precipitation.

Preferably in the method of the present invention, the particles, the metal salt, the solvent and the pH agent are charged to a reactor. The reactor may be a batch reactor or a continuous reactor. If a batch reactor is used it may be fitted with a condenser. The addition of the pH agent generally facilitates the reaction between the metal salts to produce the particles. The contents of the reactor may be agitated and the temperature of the reactor optionally raised if desired. The temperature of the reactor may be raised above the boiling point of the solvent to increase the rate of reaction. In one embodiment, the temperature of the reactor may be increased from 50 to 150° C. if desired. The pressure in the reactor may range from below atmospheric to 30 pounds per square inch.

During the reaction, the metal salt reacts with itself to produce the particles. As noted above, the particles comprise metal oxide species and metal hydroxide species. The metal oxide species in the particles are present in a larger amount than the metal hydroxide species in the particles. Preferably the resultant particles are either encapsulated by the anions from the metal salt or by the added ligand. The encapsulation of the particles facilitates suspension of the particles in the solvent and helps stabilize the particles from precipitation.

As used herein, the term "metal oxide" refers to a compound having at least one metal atom and at least one oxygen atom (where the oxygen atom is bonded either to another metal atom or to another oxygen atom) of varying stoichiometry that is covalently bonded to the metal atom. The term metal hydroxide includes a metal atom that is covalently bonded to a hydroxyl group. In one embodiment, the metal oxide in the particle (that is used to form the thin film) is a mixed metal oxide comprising at least two different metal atoms (e.g., an aluminosilicate that contains both aluminum and silicon). In another embodiment, the metal oxide in the particles may comprise two or more mixed metal oxides (e.g., silica and alumina, zirconia and titania, and the like).

The particles may be electrically conducting, electrically semi-conducting, electrically insulating, or a combination thereof. Preferably the metal oxide particles are transparent, electrically insulating metal oxides. Examples of suitable transparent, electrically insulating metal oxides include alumina ($Al_2O_3$), silica ($SiO_2$), titania ($TiO_2$), yttria ($Y_2O_3$), zirconia ($ZrO_2$), or a combination comprising at least one of the foregoing transparent, electrically insulating metal oxides.

Preferably the metal oxide in the particles is an electrically conducting or semi-conducting metal oxide also referred to as a transparent conductive oxide (TCO). Examples of suitable transparent electrically conducting or semi-conducting metal oxides include zinc oxide (ZnO), indium oxide ($In_2O_3$), cadmium oxide (CdO), gallium oxide ($Ga_2O_3$), tin oxide (SnO or $SnO_2$), or a combination comprising at least one of the foregoing. Examples of suitable transparent conductive metal oxide nanoparticles in which the metal oxide is a mixed metal oxide include indium tin oxide (InSnO), cadmium tin oxide ($Cd_2SnO_4$), zinc tin oxide ($Zn_2SnO_4$), indium zinc oxide (InZnO), or a combination comprising at least one of the foregoing transparent electrically conducting or semi-conducting metal oxides.

Preferably the particles have various shapes including spheres, rods, faceted crystalline shapes, irregular shapes, or a combination comprising at least one of the foregoing. In an exemplary embodiment, the particles have a faceted crystalline shape.

Preferably the particles have a total metal oxide content of greater than 50 mol %, more preferably at least 65 mol %; still more preferably at least 80 mol %; most preferably at least 85 mol %, based on the total moles the particles. Preferably the particles have a total metal hydroxide content of less than or equal to 35 mol %, more preferably less than or equal to 20 mol %; most preferably less than or equal to 15 mol %, based on the total moles of the particles. The total metal oxide content and the total metal hydroxide content of the composition is measured using x-ray photo spectrometry (XPS).

Preferably the molar ratio of metal oxide species to metal hydroxide species in the particles is at least 1.2:1, more preferably greater than 2:1; still more preferably greater than 3:1; and most preferably greater than 4:1.

The reaction mixture is then disposed upon a substrate. Preferably some of the solvent is removed from the reaction mixture prior to disposing the reaction mixture on the substrate by, for example, centrifugation, decentering, or filtration. Preferably the reaction mixture is disposed on the substrate by a method selected from spin coating, dip coating, doctor blading, roll coating, spray painting, sputtering, inkjet printing, gravure printing, slot coating, screen printing or a combination comprising at least one of the foregoing.

The reaction mixture disposed upon the substrate is preferably annealed to form a coating (i.e., the thin film) on the substrate. Preferably the substrate with the reaction mixture thereon is annealed at a temperature of less than or equal to 200° C., preferably less than or equal to 180° C.; and most preferably less than or equal to 150° C. Annealing of the thin film may be carried out using any suitable method, including the thermal heating and/or absorption of energy through laser or optical irradiation, electric current assisted annealing, spark plasma annealing, microwave heating, and the like. Preferably the thin film is thermally annealed at atmospheric pressure. The thin film after annealing preferably has a thickness of 50 to 2000 nm, more preferably 100 to 1500 nm; and most preferably 500 to 1000 nm.

After the formation of the film, it may be subjected to doping with a n-type or p-type dopant to increase its electrical conductivity. Preferably the n-type or p-type dopant is any suitable dopant selected from Groups III and V of the Periodic Table of the Elements, and the like, or a combination comprising at least one of the foregoing. Examples of suitable dopants are antimony, arsenic, phosphorus, boron, fluorine, aluminum, gallium, niobium, molybdenum, sodium, manganese, zirconium, platinum, tungsten, lanthanum, strontium, copper or a combination comprising at least one of the foregoing. Examples of doped particles are aluminum-doped zinc oxide, indium-doped cadmium oxide, niobium-doped titanium dioxide, barium titanate, or a combination comprising at least one of the foregoing.

Preferably the annealed thin film is optically transparent. More preferably the annealed thin film exhibits a total transmission in the visible region (400-700 nm) of greater than 80%, most preferably greater than 90%, as measured using a HunterLab Ultra Scan XE spectrophotometer according to ASTM D1003.

Preferably the annealed thin film also exhibits a relatively wide optical band gap. Preferably wherein the bandgap is at least 1 eV, more preferably at least about 2 eV, and most preferably at least 3 eV. Leakage in pixel transistors tends to limit the contrast in display pixels, because, leakage results in black appearing in a lighter shade of gray. A wide bandgap in a thin film transistor may reduce the leakage in thin film transistor, thereby increasing the display contrast of the thin film transistor.

The thin film may be used as a thin film transistor. Preferably the conducting or semi-conducting thin film is incorporated into an electronic display applications as a thin film transistor (TFT). TFTs are formed by depositing thin films including a semiconducting or conducting active layer, dielectric layer on a supporting substrate. The TFT may be formed using any suitable method, including but not limited to, a top gate process or a bottom gate process. In the top gate process, a channel film is formed first, and a gate insulator and a gate electrode are deposited after the channel film is formed. In the bottom gate process, a channel film is formed over previously deposited gate electrode and gate insulator. The gate insulator is formed from any suitable material, including but not limited to, silicon dioxide, alumina, zirconia, yttria, hafnia, or the like, or a combination comparing at least one of the foregoing. Gate and source/drain electrodes are formed from any suitable conductor and/or semiconductor including, but not limited to, metals, heavily doped semiconductors or transparent conductors, or a combination comprising at least one of the foregoing.

Preferably a TFT comprising an annealed thin film produced as described herein exhibits a field effect mobility greater than 0.1 cm$^2$/V$^{-s}$, preferably of 0.1 to 0.5 cm$^2$/V$^{-s}$ measured at 150° C. and of 1 to 2 cm$^2$/V$^{-s}$ measured at 200° C. The mobility is determined from the electrical characteristics of the TFT. The term "mobility" refers to the mobility of electrons or holes in the thin film. Higher mobility results in faster switching and/or greater current for thin film transistor. A greater current in turn increases the speed and brightness of a TFT display.

Preferably the good transparency of the thin film allows for size or area of the TFT to be increased when used as a pixel transistor within a display, allowing for a greater amount of current to pass through the TFT without requiring increased operating voltages.

The TFT comprising the thin film described herein preferably exhibits a high ratio of on state to off-state current ($I_{ON}/I_{OFF}$). Preferably the switching of the thin film exhibits a $I_{ON}/I_{OFF}$ ratio of greater than about $10^4$. More preferably the switching of the thin film exhibits a $I_{ON}/I_{OFF}$ ratio of equal to or greater than about $10^6$.

The composition and methods described herein provide thin films and thin film transistors which have good transparency, good brightness, a wide bandgap, and/or high mobility. The particular selection of the pH, pH agent and/or metal salt is used to produce the thin film allows for the reactions therein to be tailored to drive the formation of metal oxide species over the formation of metal hydroxide species. As a result, thin films which impart one or more of the above properties to electronic display applications in which they are used are capable of being formed at significantly lower temperatures, thereby reducing energy and/or processing costs.

The invention is further described by the following non-limiting examples.

EXAMPLES

Example 1

This example was conducted to show the favorable formation of metal oxide nanoparticles formed during sol-gel deposition at low temperatures. In this example, metal oxide nanoparticles were synthesized at a pH of 11 by mixing 0.439 grams of a zinc acetate metal salt, 10 milliliters of methanol as a solvent and 120 micro liters of a ammonium hydroxide (NH$_4$OH) pH agent. The reaction product was deposited onto a glass substrate and annealed at a temperature of 150-200° C.

The resulting thin film was analyzed by X-ray spectroscopy (XPS), the results of which are shown in FIG. 1. FIG. 1 is an XPS spectra graph of the intensity in counts per second (CPS) versus the binding energy (eV) of the thin film described herein.

As can be seen by the results in FIG. 1, favorable formation of metal oxide nanoparticles was obtained and hydroxide formation was suppressed, with 50.53% of the thin film being composed of metal oxides and 49.47% being composed of metal hydroxides. In other words, at least half of the oxygen are part of a metal oxide—the other half being part of a metal hydroxide.

The resulting zinc oxide nanoparticles had an average size of about 10-20 nm and a morphology composed of multiple crystallites. The product films exhibited a field effect mobility of between 0.1 and 0.5 cm$^2$/V$^{-s}$ at 150° C. and between 1-2 cm$^2$/V$^{-s}$ at 200° C. and a switching value $I_{ON}/I_{OFF}$ of $10^6$ at 150° C. and 200° C.

Similar results were obtained when Example 1 was repeated using an indium acetate metal salt instead of zinc acetate. The results of all the above samples were also confirmed via X-ray diffraction (XRD) analysis.

Comparative Example 2

Comparative example 2 was conducted to show that reference metal oxide particles do not become active until annealed to a temperature of 400° C. 0.02 grams of synthesized particles of 3 nanometer diameter ZnO$_2$ obtained from synthesis were solution deposited on a glass substrate to form a thin film. The thin film was then annealed at incrementally increasing temperatures. The particles were synthesized by reacting 1 gram zinc acetate with 0.3 grams NaOH in 300 mL 2-propanol. After 15 minutes, dodecanethiol encapsulant (~1 mL) was added. After 2 hours, the resulting thiol-encapsulated ZnO nanoparticles were collected and purified.

Figures 2, 3:
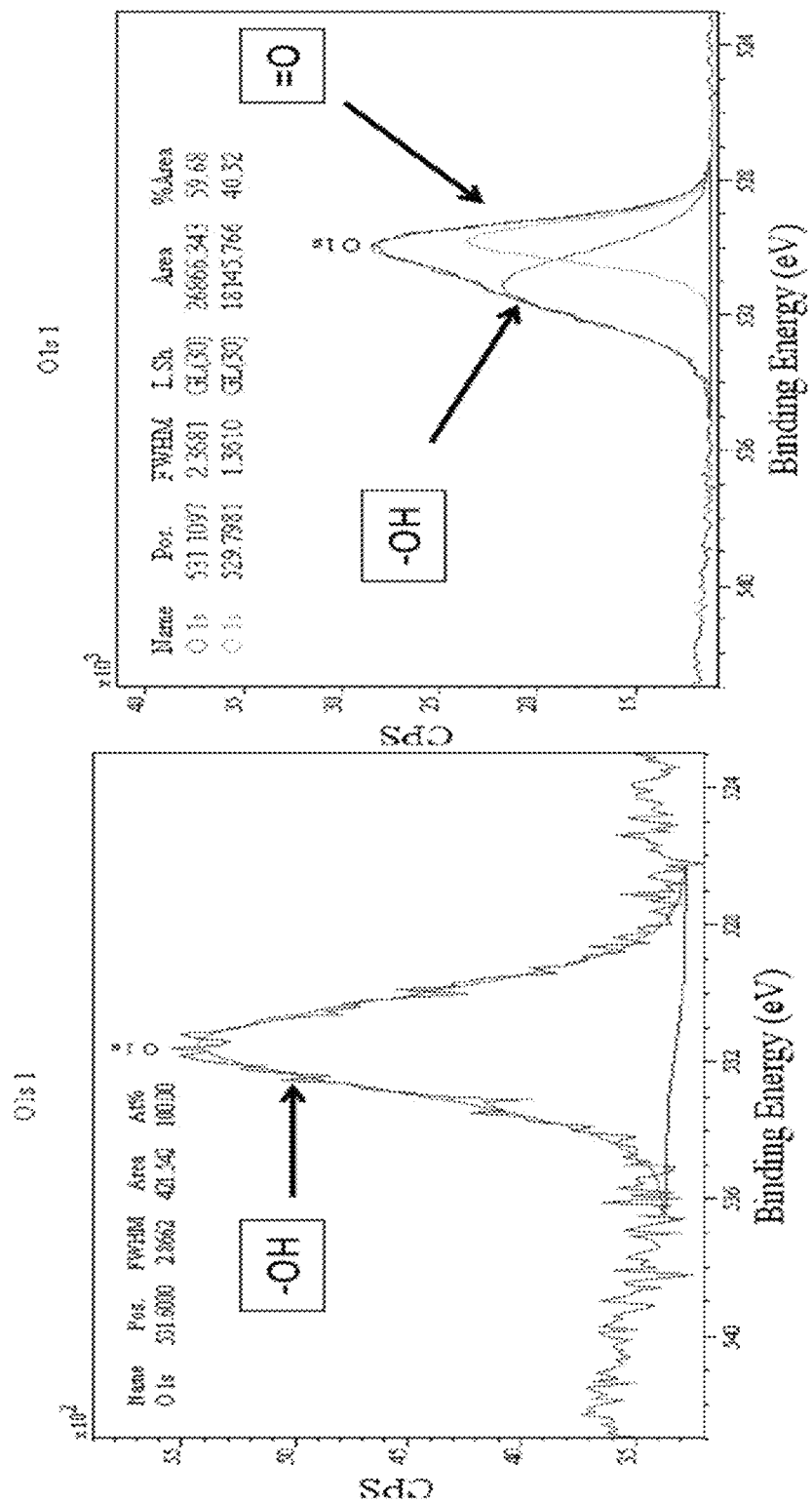
FIG. 2 is an XPS spectrum graph of the CPS versus the binding energy (eV) of a comparative thin film following deposition.
FIG. 3 is an XPS spectrum graph of the CPS versus the binding energy (eV) of the comparative thin film following annealing of the comparative thin film at a temperature greater than 400° C.

The deposited particles were analyzed by X-ray spectroscopy (XPS) prior to annealing and the resulting thin film after annealing. FIG. 2 is an XPS spectra graph of the intensity in counts per second (CPS) versus the binding energy (eV) of the deposited particles prior to annealing. FIG. 3 is an XPS spectra graph of the intensity in counts per second (CPS) versus the binding energy (eV) of the thin film after annealing.

As can be seen by the results in FIG. 2, prior to annealing, the deposited particles in the thin film are predominantly hydroxides. Although not wishing to be bound by theory, this is likely due to the favorable formation of hydroxides at low temperatures. In contrast, with reference to FIG. 3, the thin film did not become active, i.e., for conversion to metal oxide particles, until the annealing temperature reached at least 400° C.

The results of Examples 1 and Comparative Example 2 demonstrate that by carefully selecting the metal salt and pH, the formation of hydroxide compounds at low temperatures are suppressed.

This invention may be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The transition term "comprising" is inclusive of the transition terms "consisting of" and "consisting essentially of".

All numerical ranges included herein are interchangeable and are inclusive of end points and all numerical values that lie between the endpoints.

The terms "hydrolysis", "decompose", "decomposition" and/or "degradable" refer to the conversion of materials into smaller components, intermediates, or end products.

The term and/or is used herein to mean both "and" as well as "or". For example, "A and/or B" is construed to mean A, B or A and B.

While the invention has been described in detail in connection with a number of embodiments, the invention is not limited to such disclosed embodiments. Rather, the invention can be modified to incorporate any number of variations, alterations, substitutions or equivalent arrangements not heretofore described, but which are commensurate with the scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A composition for making a thin film comprising:
a solvent;
a plurality of particles; the particles being derived by reacting a metal salt with itself or with a ligand; where the metal salt forms metal oxides and metal hydroxides upon reacting with itself or with a ligand; and where the particles have a metal oxide content that is substantially greater than their metal hydroxide content when heated at a temperature of less than or equal to 200° C.,
wherein a thin film transistor comprising the thin film exhibits a field effect mobility of from 0.1 $cm^2/V^{-s}$ to 0.5 $cm^2/V^{-s}$ measured at 150° C. and of from 1 $cm^2/V^{-s}$ to 2 $cm^2/V^{-s}$ measured at 200° C.

2. The composition of claim 1, wherein a molar ratio of metal oxide content to the metal hydroxide content is at least 1.2:1.

3. The composition of claim 1, wherein a cation in the metal salt is zinc, tin, indium, gallium, titanium, niobium, tungsten, strontium, zirconium, or a combination comprising at least one of the foregoing cations.

4. The composition of claim 1, wherein an anion in the metal salt is acetate ($CH_3COO-$), carbonate ($CO_3^{2-}$), chloride ($Cl^-$), citrate ($HOC(COO^-)(CH_2COO^-)_2$), cyanide ($C\equiv N^-$), nitrate ($NO_3^-$), nitrite ($NO_2^-$), phosphate ($PO_4^{3-}$), sulfate ($SO_4^{2-}$), or a combination comprising at least one of the foregoing anions.

5. The composition of claim 1, where the solvent solubilizes the metal salt.

6. The composition of claim 1, further comprising a pH agent that controls the pH of the composition to be 8 to 12.

* * * * *